United States Patent
Zainuddin et al.

(10) Patent No.: US 12,417,809 B2
(45) Date of Patent: Sep. 16, 2025

(54) OPEN BLOCK READ ICC REDUCTION

(71) Applicant: Sandisk Technologies, Inc., Milpitas, CA (US)

(72) Inventors: Abu Naser Zainuddin, Milpitas, CA (US); Jiahui Yuan, Fremont, CA (US); Deepanshu Dutta, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 206 days.

(21) Appl. No.: 18/360,634

(22) Filed: Jul. 27, 2023

(65) Prior Publication Data

US 2024/0290395 A1    Aug. 29, 2024

Related U.S. Application Data

(60) Provisional application No. 63/486,841, filed on Feb. 24, 2023.

(51) Int. Cl.
*G11C 16/28* (2006.01)
*G11C 16/04* (2006.01)
(Continued)

(52) U.S. Cl.
CPC .......... *G11C 16/28* (2013.01); *G11C 16/0433* (2013.01); *G11C 16/08* (2013.01); *G11C 16/24* (2013.01)

(58) Field of Classification Search
CPC ..... G11C 16/28; G11C 16/0433; G11C 16/08; G11C 16/24; G11C 11/5642;
(Continued)

(56) References Cited

U.S. PATENT DOCUMENTS 7,440,327 B1    10/2008    Sekar et al.
7,876,611 B2    1/2011    Dutta et al.
(Continued)

FOREIGN PATENT DOCUMENTS

KR    10-2274846 B1    7/2021
WO    WO2022/188085 A1    9/2022

OTHER PUBLICATIONS

ONFI, "Open NAND Flash Interface Specification," Rev. 5.1, May 2022, 398 pages.
(Continued)

*Primary Examiner* — Amir Zarabian
*Assistant Examiner* — Bradley S Coon
(74) *Attorney, Agent, or Firm* — Pearl Cohen Zedek Latzer Baratz LLP

(57) ABSTRACT

Technology for a storage system that reduces the Icc during open block reads. A lower than nominal voltage may be applied to the bit lines during open block reads, which reduces Icc. A nominal bit line voltage may be used during closed block reads. The lower than nominal bit line voltage may be combined with using a lower than nominal read pass voltage (Vread) to unprogrammed word lines during the open block read. The lower than nominal Vread has a lower magnitude than a nominal Vread used during a closed block read. Combining the lower than nominal bit line voltage with the lower than nominal Vread to unprogrammed word lines further reduces Icc during open block reads. The ramp rate of Vread may be relaxed (made slower) during at least some open block reads in combination with the lower than nominal bit line voltage.

12 Claims, 18 Drawing Sheets

(51) Int. Cl.
*G11C 16/08* (2006.01)
*G11C 16/24* (2006.01)

(58) Field of Classification Search
CPC ..... G11C 16/0483; G11C 16/10; G11C 16/26; G11C 16/3427; G11C 16/3459
See application file for complete search history.

(56) References Cited

U.S. PATENT DOCUMENTS

| | | | |
|---|---|---|---|
| 8,743,615 | B2 | 6/2014 | Lee et al. |
| 9,202,579 | B2 | 12/2015 | Hsiung et al. |
| 9,449,700 | B2 | 9/2016 | Shah et al. |
| 9,552,885 | B2 | 1/2017 | Shukla et al. |
| 10,930,355 | B2 | 2/2021 | Yang et al. |
| 11,189,337 | B1 | 11/2021 | Lien et al. |
| 11,238,933 | B2 | 2/2022 | Joe |
| 11,475,961 | B1 | 10/2022 | Islam et al. |
| 11,521,688 | B2 | 12/2022 | Lu et al. |
| 2008/0094902 | A1 | 4/2008 | Lee |
| 2015/0103595 | A1* | 4/2015 | Dunga ............... G11C 16/24 365/185.21 |
| 2016/0064092 | A1 | 3/2016 | Roy et al. |
| 2016/0172045 | A1 | 6/2016 | Shukla et al. |
| 2019/0034290 | A1 | 1/2019 | Guo et al. |
| 2019/0333588 | A1 | 10/2019 | Yang et al. |
| 2021/0375349 | A1* | 12/2021 | Lien ................... G11C 11/4085 |
| 2021/0375371 | A1* | 12/2021 | Lien ................... G11C 16/0483 |

OTHER PUBLICATIONS

U.S. Appl. No. 17/825,321, filed May 26, 2022.
U.S. Appl. No. 17/837,345, filed Jun. 10, 2022.
U.S. Appl. No. 63/419,432, filed Oct. 26, 2022.
International Search Report & The Written Opinion of the International Searching Authority dated May 22, 2024, International Application No. PCT/US2024/012668.
English Abstract of KR Publication No. KR10-2274846 published Jul. 8, 2021.

* cited by examiner

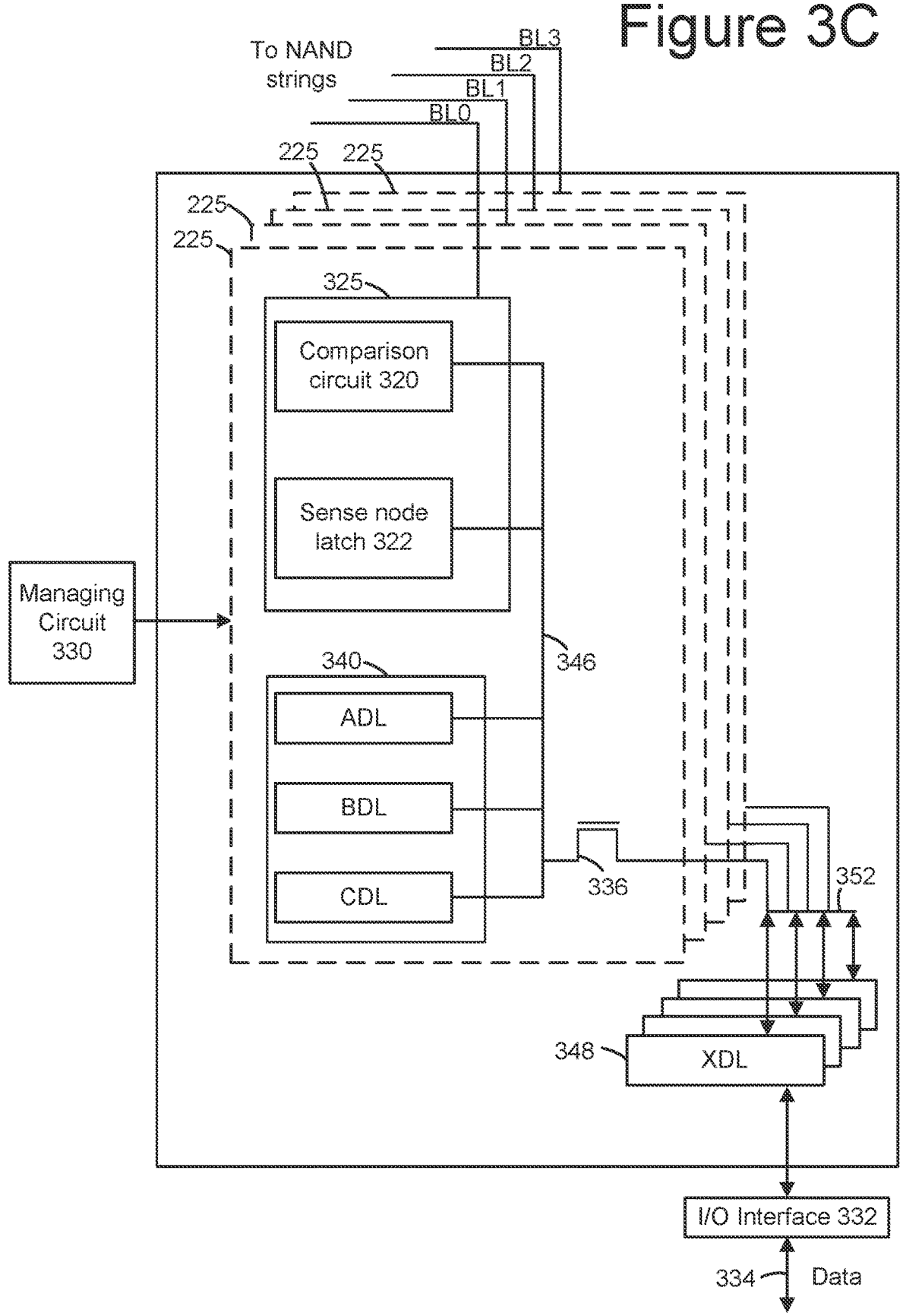

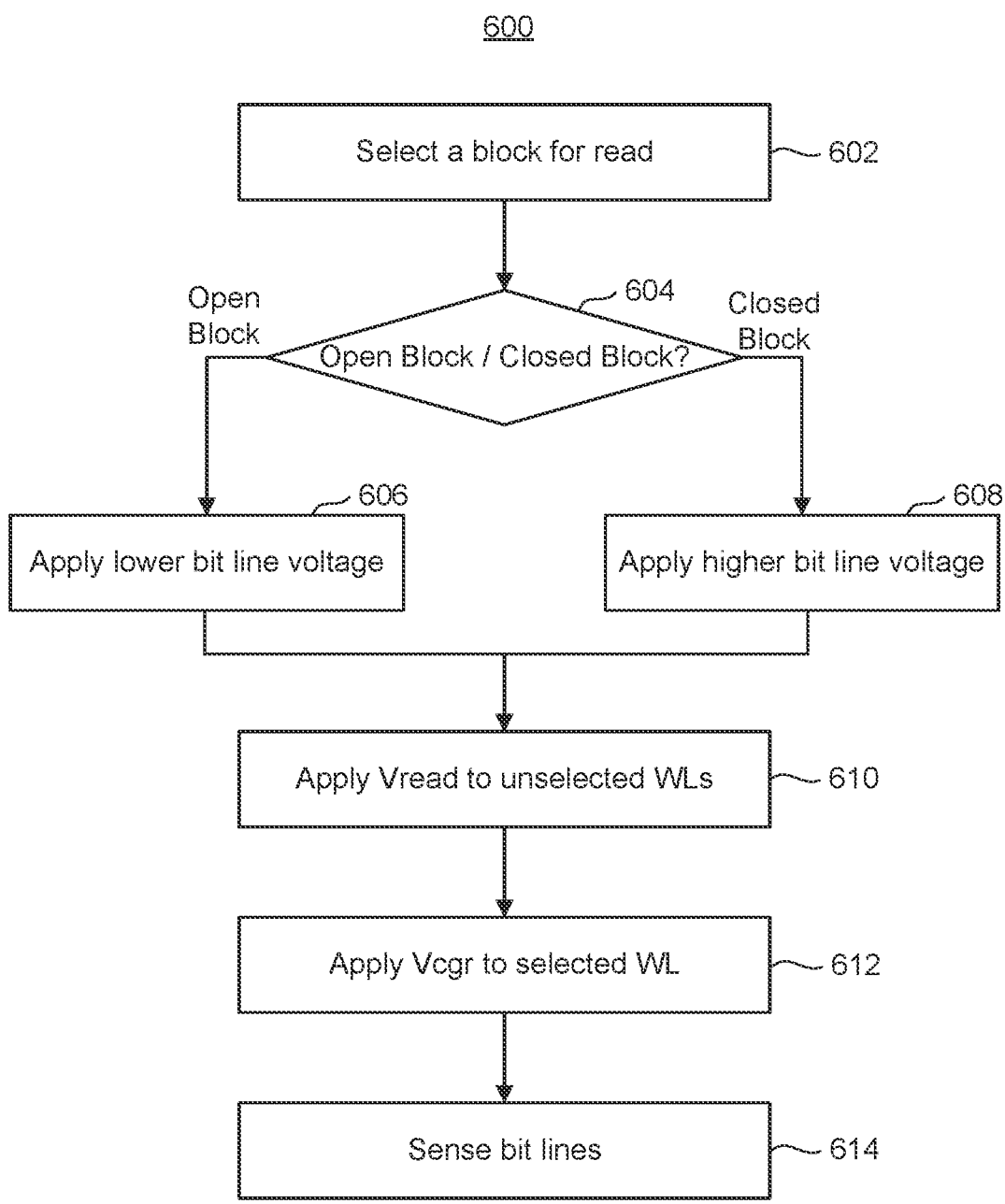

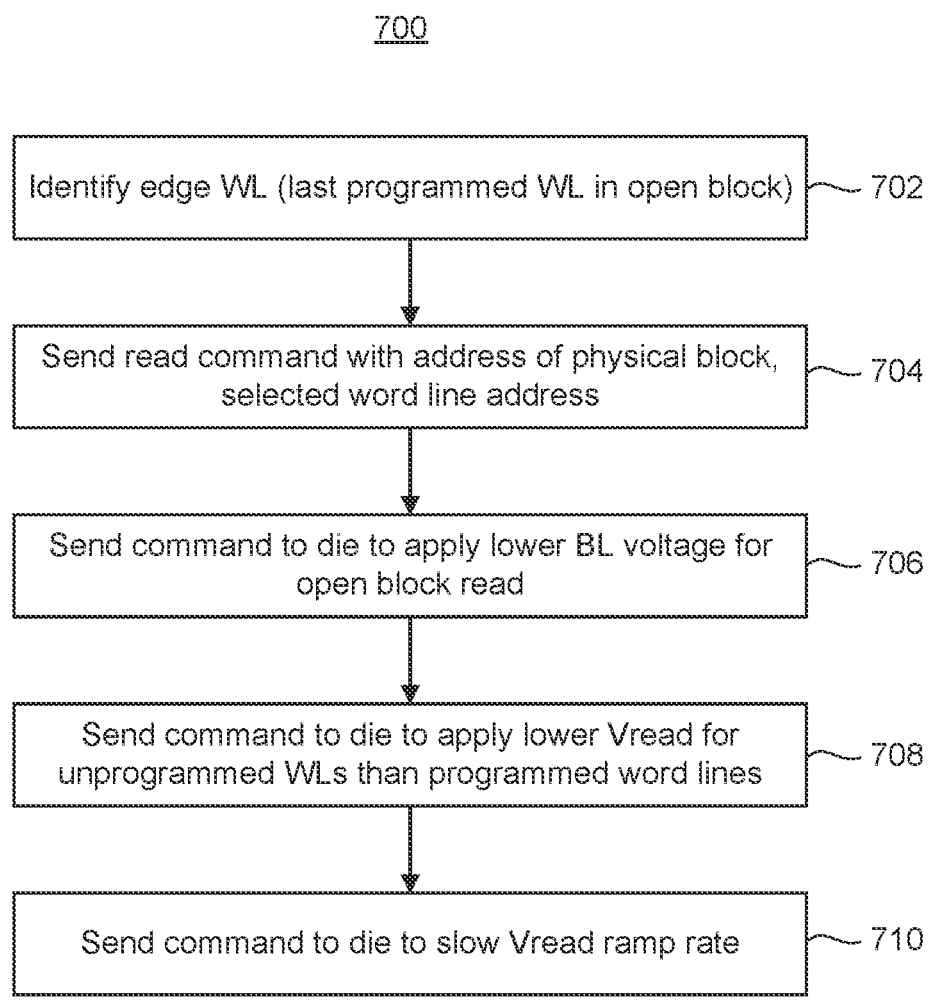

OPEN BLOCK READ ICC REDUCTION

CLAIM OF PRIORITY

The present application claims priority from U.S. Provisional Patent Application No. 63/486,841, entitled "OPEN BLOCK READ ICC REDUCTION," by Zainuddin et al., filed Feb. 24, 2023, incorporated by reference herein in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. Herein, a memory system that uses non-volatile memory for storage may be referred to as a storage system. The memory structure may be three-dimensional (3D). One type of 3D structure has non-volatile memory cells arranged as vertical NAND strings. The 3D memory structure may be arranged into units that are commonly referred to as physical blocks. For example, a physical block in a NAND memory system contains many NAND strings. A NAND string contains memory cell transistors connected in series, a drain side select gate at one end, and a source side select gate at the other end. Each NAND string is associated with a bit line. The physical block typically has many word lines that provide voltages to the control gates of the memory cell transistors. In some architectures, each word line connects to the control gate of one memory cell on each respective NAND string in the physical block.

One type of three-dimensional memory structure has alternating dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with materials including a charge-trapping material to create a vertical column of memory cells (e.g., NAND string). The semiconductor fabrication process for forming a three-dimensional memory structure may result in location dependent physical differences between similar structures.

For memory such as NAND, a large set of memory cells are erased prior to programming. In some cases, the memory cells of an entire physical block are erased as a group. In some cases, the memory cells of a portion of a physical block are erased as a group. The memory cells are programmed one group at a time. The unit of programming is typically referred to as a page. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

Reading NAND memory cells includes applying a reference voltage to control gates of memory cells selected to be read ("selected memory cells"), which is typically done by apply the reference voltage to the word line connected to the selected memory cells ("selected word line"). Also, read pass voltages are applied to control gates of other memory cells on the NAND strings in order to force those "unselected memory cells" to conduct a current. The bit lines connected to the NAND strings are sensed to determine a condition of the respective selected memory cells. If the bit line has a significant current this means that the corresponding selected memory cell has a Vt below the reference voltage.

The term "open block" is defined herein to refer to a physical block of memory cells that has been erased but has not yet been fully programmed (e.g., at least one word line in the physical block has not yet been programmed). As noted, a physical block could be programmed one word line at a time, such that in an open block memory cells connected to some of the word lines are programmed whereas memory cells connected to the other word lines remain erased. The term "closed block" is defined herein to refer to a physical block that has been fully programmed (e.g., all word lines in the physical block have been programmed).

There are often limits to the peak current that can be provided from the host device to the storage system. The term "peak Icc" is used herein to refer to the peak amount of current that is drawn by the storage system. The term "Icc" is typically used to refer to a current provided to the storage system by a power source. The term "specified peak Icc" refers to a maximum allowed peak Icc. For example, there may be a specification that defines the specified peak Icc. If the peak current drawn by the storage system is greater than the specified peak Icc, then the magnitude of the supply voltage may drop, which can result in operation failure in the storage system. Much of the power and/or current that is used by the storage system is used to perform memory operations such as reading the memory cells on the memory dies. Hence, the regulation of the power and/or current used by the memory dies is important in order to keep the peak Icc of the storage system within the specified peak Icc. It is also important to control the average Icc drawn by the storage system. Reducing the average Icc can reduce power consumption.

BRIEF DESCRIPTION OF THE DRAWINGS

Like-numbered elements refer to common components in the different figures.

FIG. 3C is a block diagram depicting one embodiment of a portion of column control circuitry that contains a number of read/write circuits.

FIG. 6 is a flowchart of one embodiment of a process of reading memory cells.

FIG. 7 is a flowchart of one embodiment of a process of establishing read parameters for an open block read of memory cells.

DETAILED DESCRIPTION

Technology is disclosed herein for a storage system that reduces the peak Icc and/or average Icc during open block reads. A very large peak Icc can be drawn by the storage system when reading open blocks. Also, a very large average Icc can be drawn by the storage system when reading open blocks. A factor that leads to the higher Icc in open block reads is the over-driving of memory cells that are in the erased state. Therefore, a higher number of erased cells in the open block may lead to a higher Icc. In an embodiment, a lower than nominal voltage is applied to the bit lines during open block reads, which reduces peak Icc and/or average Icc. The lower than nominal voltage is in contrast to a nominal bit line voltage used during closed block reads. The lower than nominal bit line voltage may be combined with using a lower than nominal read pass voltage (Vread) to unprogrammed word lines during the open block read. An unprogrammed word line refers to a word line for which all memory cells are still in the erased state following erase. The lower than nominal Vread has a lower magnitude than a nominal Vread used during a closed block read. Combining the lower than nominal bit line voltage with the lower than nominal Vread to unprogrammed word lines further reduces peak Icc and/or average Icc during open block reads. In one embodiment, the ramp rate of Vread is relaxed (made slower) during at least some open block reads in combination with the lower than nominal bit line voltage. In at least some cases, the slower ramp rate of Vread makes the lower than nominal bit line voltage more effective at reducing peak Icc and/or average Icc.

Figure 1:
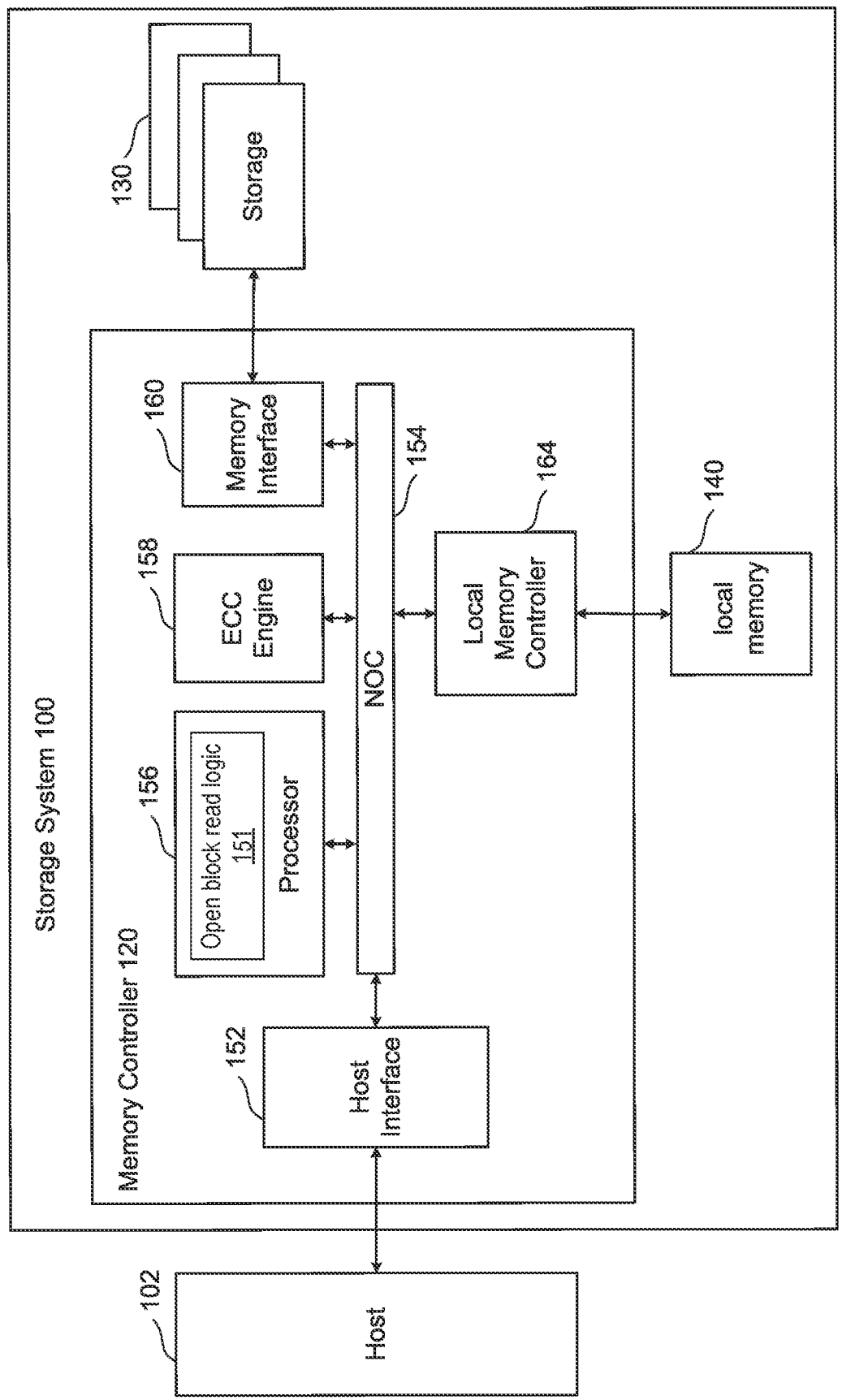
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

In an embodiment, the memory controller 120 has logic that manages open block reads in the storage. As one example, the processor 156 may implement the open block read logic 151. In an embodiment, the memory controller 120 issues one or more commands to the storage 130 that instructs the storage to implement a power/Icc saving mode for open block reads. In one embodiment, the memory controller 120, when processing read requests from the host 102, determines whether a read will result in an open block read. If so, the memory controller 120 instructs the storage 130 to change one or more operating parameters for open block read. In one embodiment, the memory controller 120 instructs the storage 130 to use a lower bit line voltage during an open block read than for a closed block read. In one embodiment, the memory controller 120 instructs the storage 130 to use a lower ramp rate for a read pass voltage (Vread) during an open block read than for a closed block read in combination with the lower bit line voltage. Using the lower ramp rate for the read pass voltage (Vread) can, in some cases, improve the effectiveness of the lower bit line voltage at saving power/Icc. In one embodiment, the memory controller 120 instructs the storage 130 to apply a lower Vread to unprogrammed word lines than for programmed word lines during an open block read in combination with the lower bit line voltage.

Figure 2A:
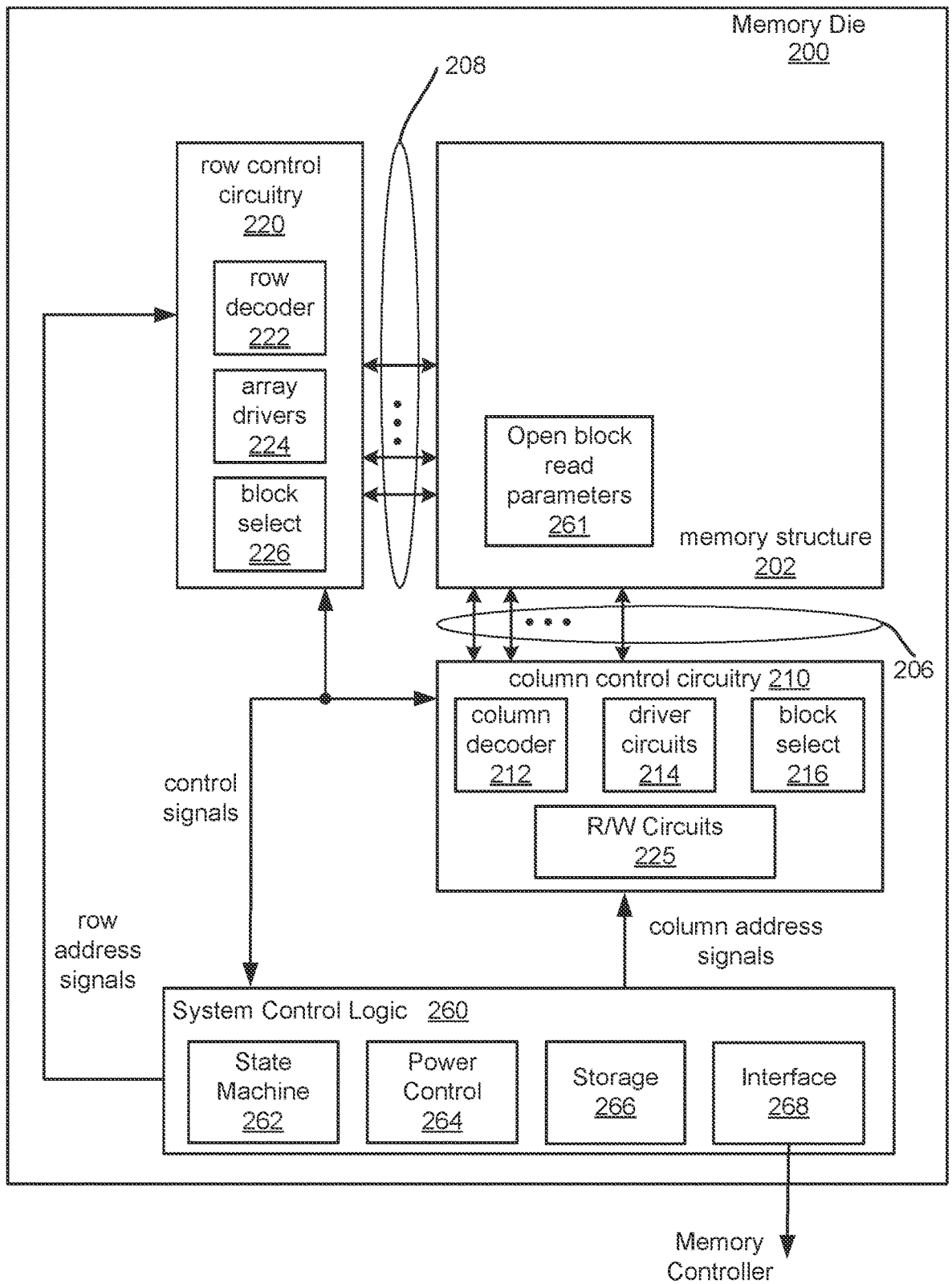
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuitry 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202. Among the parameters are open block read parameters 261. The memory structure 202 may store the open block read parameters 261, which may be loaded into storage 266 when the die is powered on. Such open block read parameters 261 may include one or more voltages to apply to bit lines during an open block read, as well as a voltage to apply to bit lines during a closed block read. The magnitude of the voltage to apply to bit lines during the open block read may depend on how many word lines are programmed in the open block. The parameters may also include a ramp rate for a read pass voltage (e.g., Vread) during an open block read, as well as a ramp rate for the read pass voltage (e.g., Vread) during a closed block read. The parameters may also include a magnitude for a read pass voltage (e.g., nominal Vread) for programmed word lines and a magnitude for the read pass voltage (e.g., less than nominal Vread) for unprogrammed (or erased) word lines during the open block read. In an embodiment, the state machine 262 is configured to apply one or more of the open block read parameters 261 during an open block read of the memory structure 202. For example, the state machine 262 may control one or more of the bit line voltage, the magnitude of Vread, and/or the ramp rate of Vread during the open block read based on the parameters 261. The state machine 262 may also respond to commands from the memory controller 120 with respect to the execution of the open block read.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used. The commands may include one or more commands to execute an open block read in accordance with one or more embodiments described herein.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
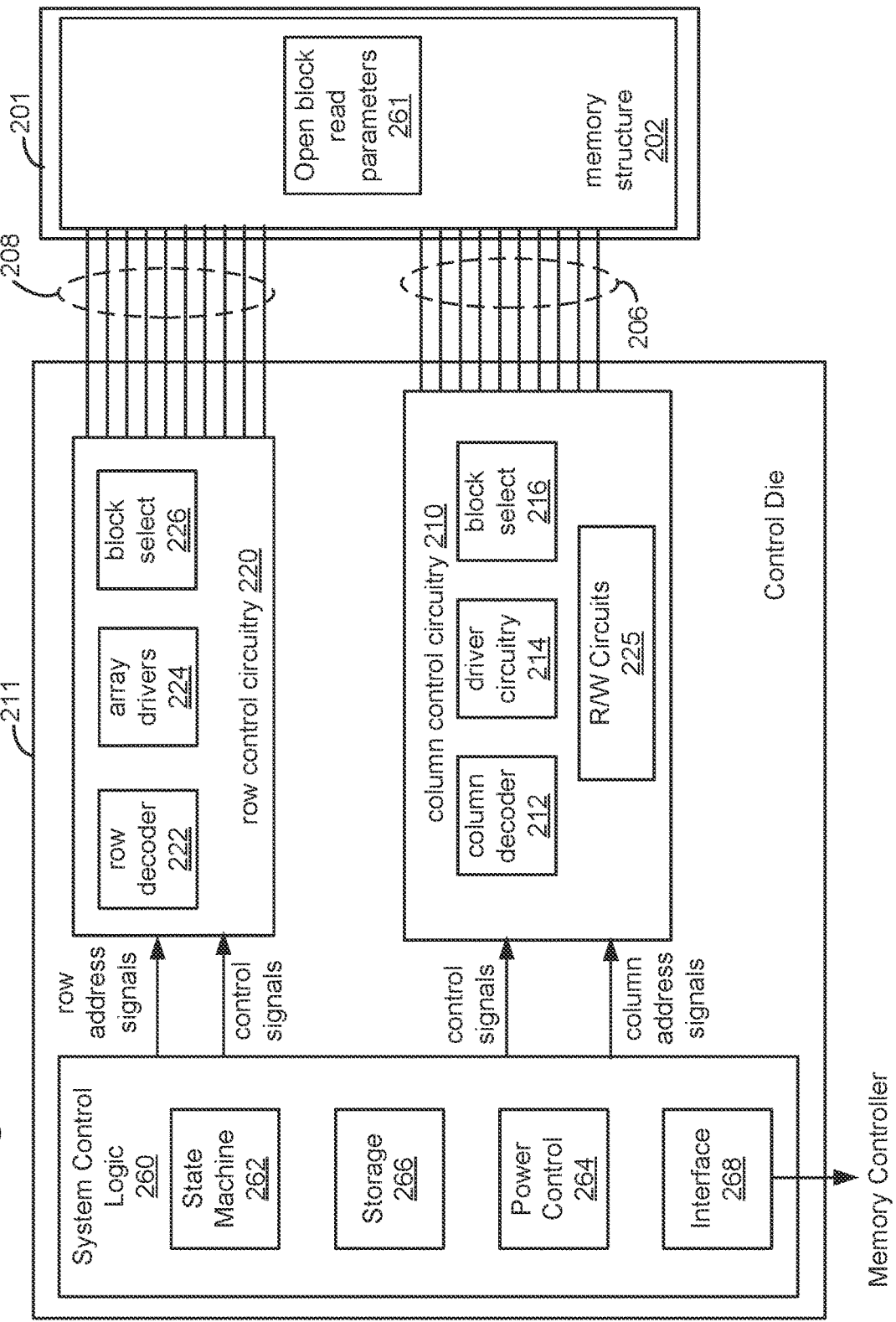
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
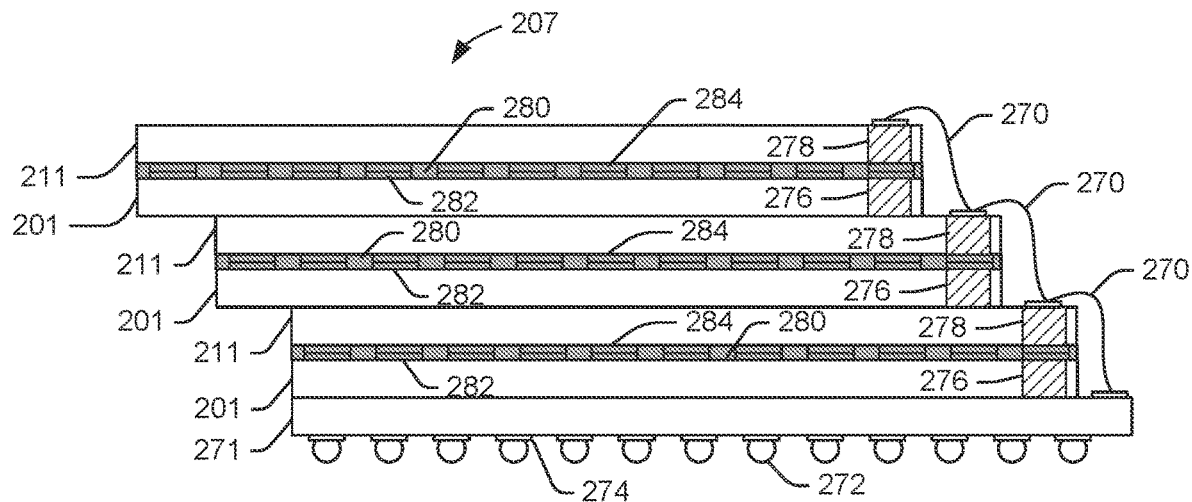
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
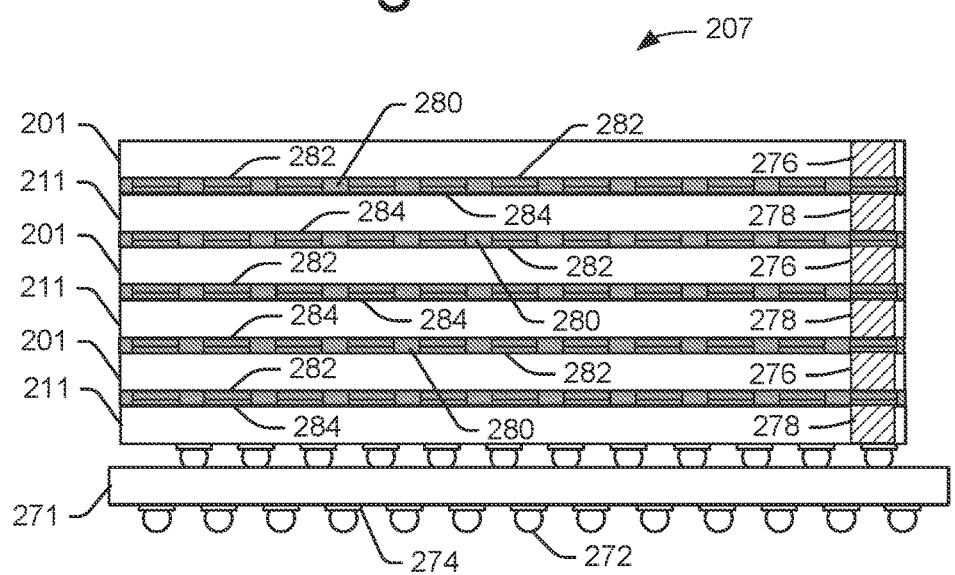

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier. In an embodiment, the magnitude of the voltage applied to the bit line is lower for an open block read than for a closed block read. In an embodiment, the magnitude of the voltage applied to the bit line for an open block read depends on how many word lines in the physical block are unprogrammed.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
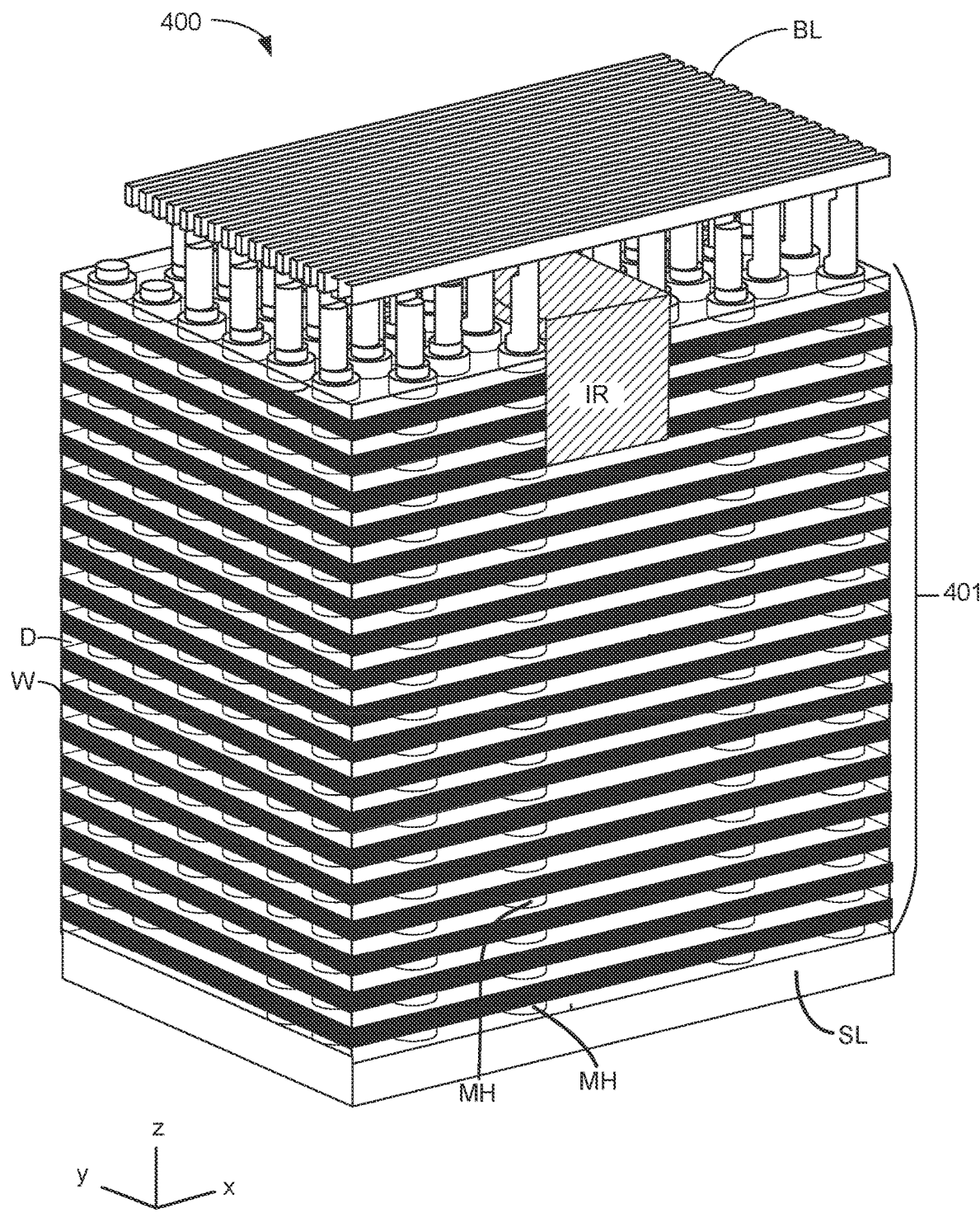
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
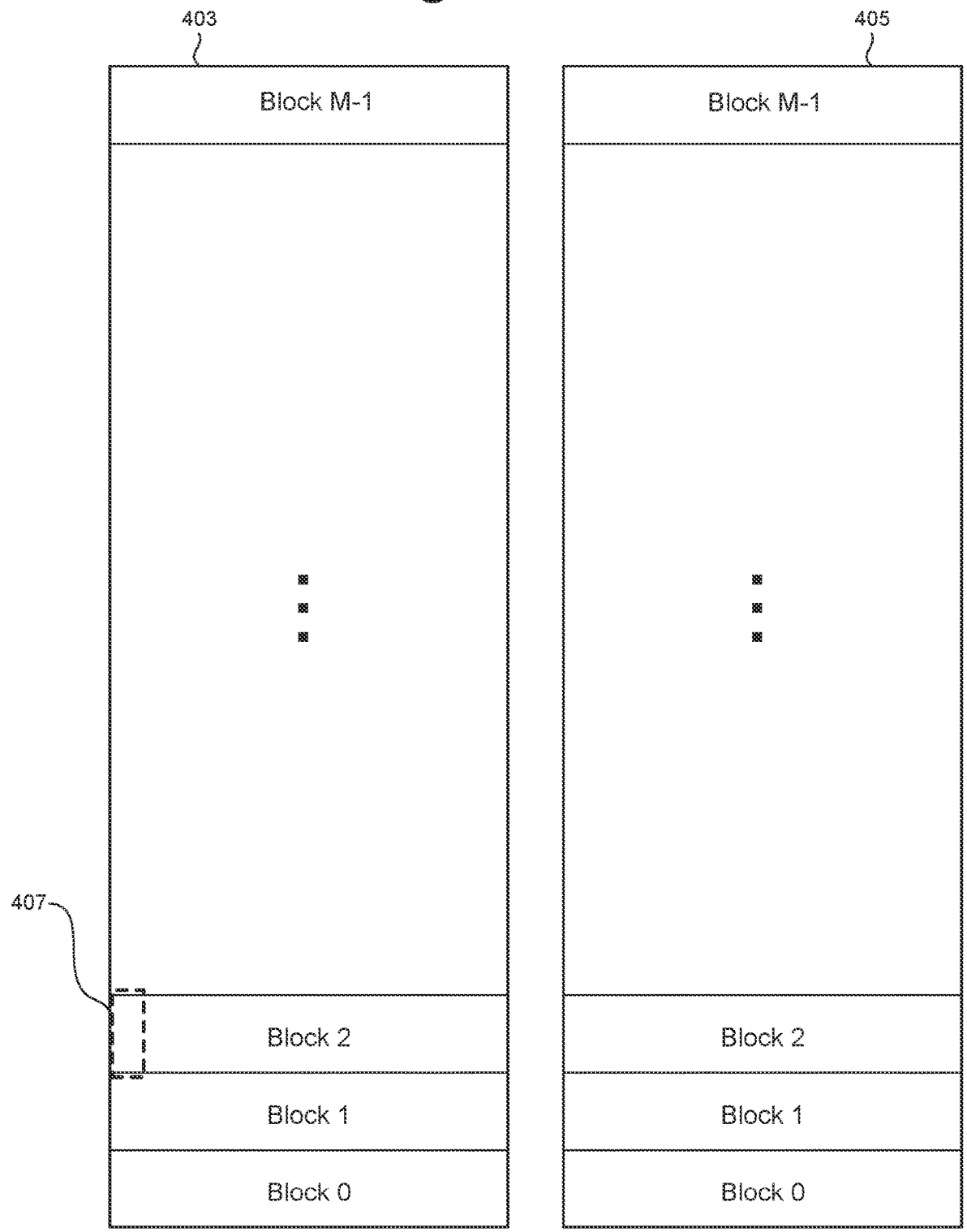
FIG. 4A is a block diagram of one embodiment of a memory structure having two planes.

FIG. 4A is a block diagram explaining one example organization of memory structure 202, which is divided into two planes 403 and 405. Each plane is then divided into M physical blocks. In one example, each plane has about 2000 physical blocks (or more briefly "blocks"). However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
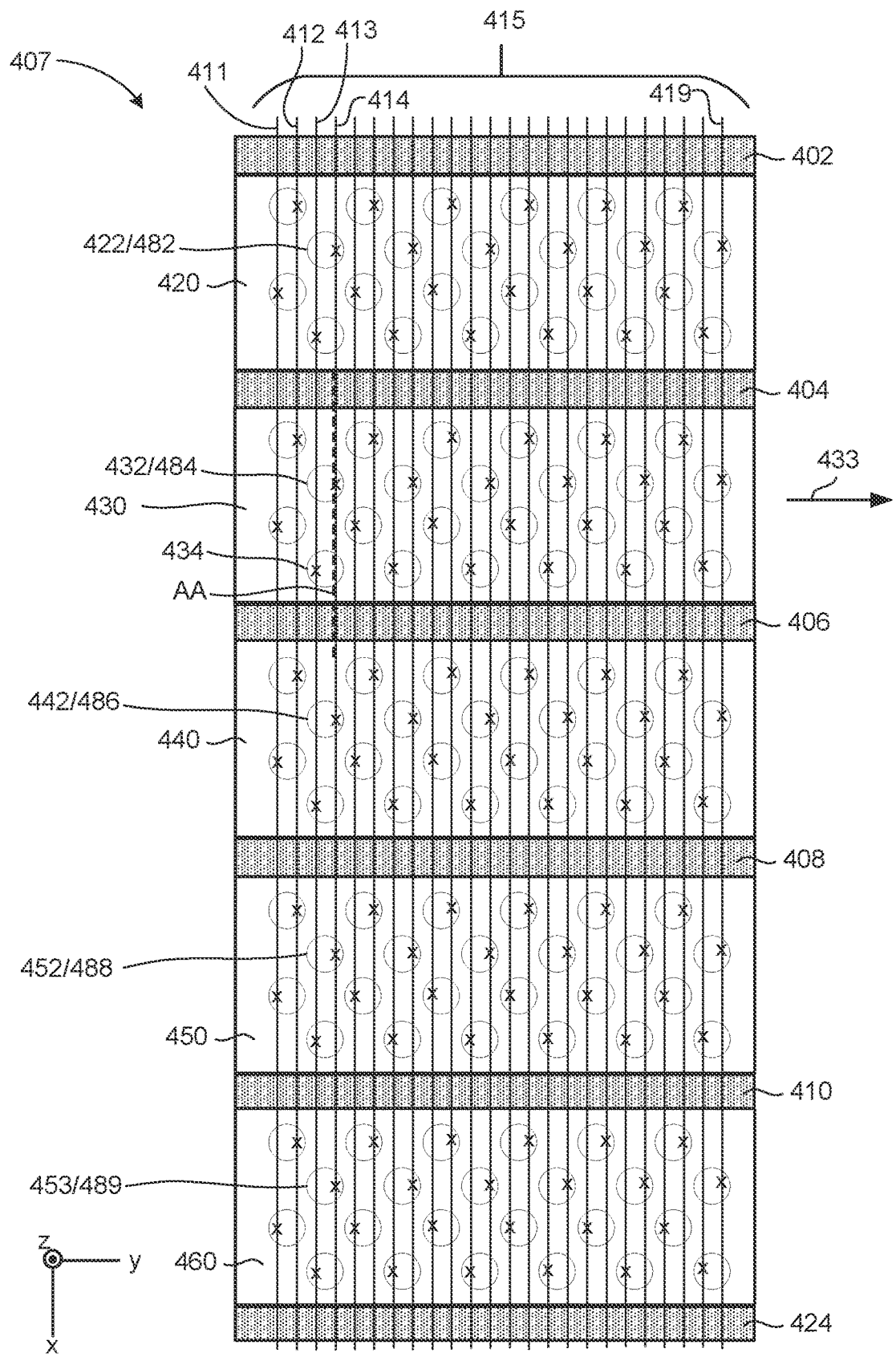
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, 410, and 424, which are formed of SiO$_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the physical block 407 from adjacent physical blocks. Thus, isolation regions 402 and 424 may extend down to the substrate. In one embodiment, the isolation regions 404, 406, and 410 only divide the layers used to implement select gates so that NAND strings in different sub-blocks can be independently selected. Referring back to FIG. 4, the IR region may correspond to any of isolation regions 404, 406, 408, or 410. In one example implementation, a bit line only connects to one vertical column/NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
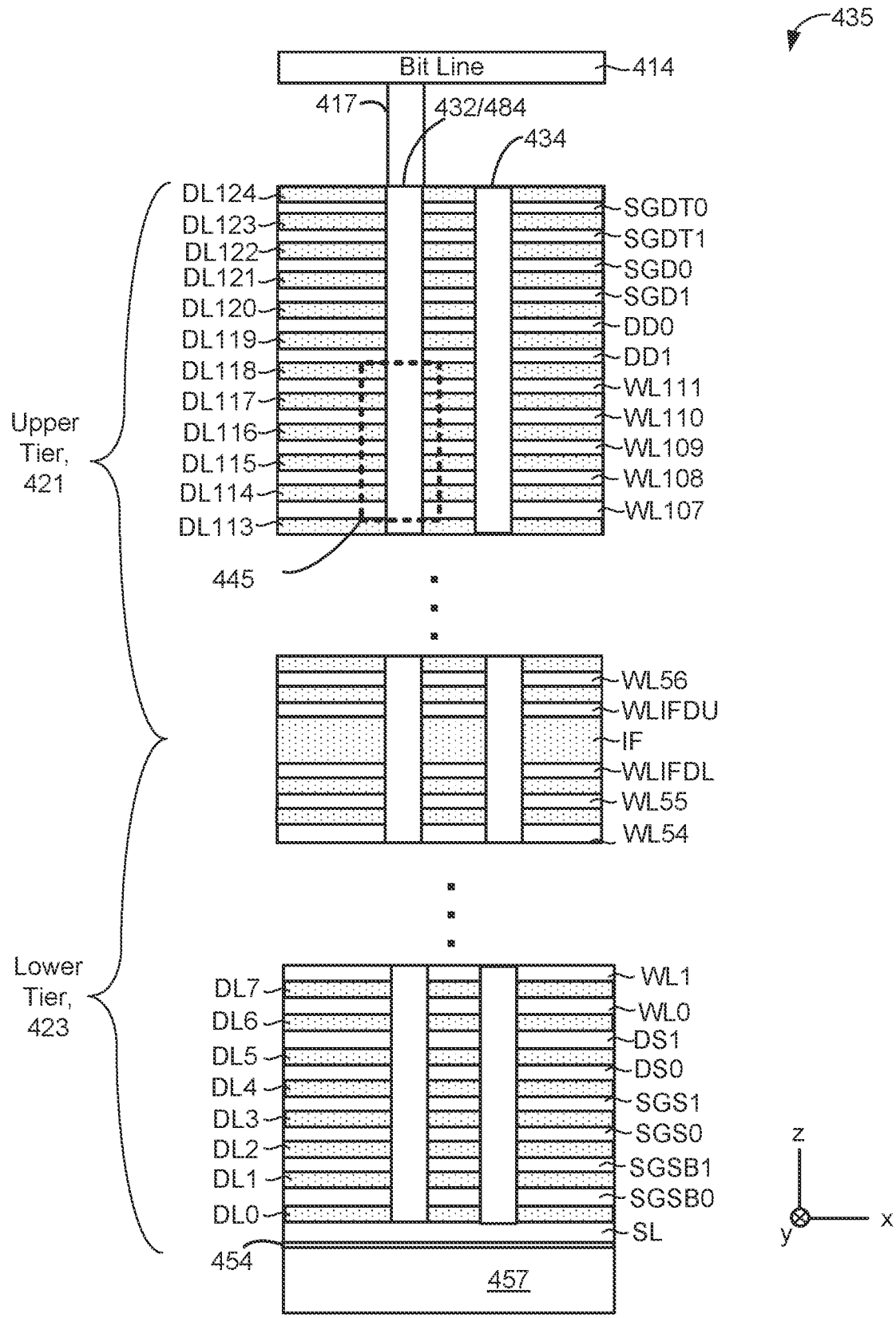
FIG. 4C depicts an embodiment of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Therefore, a number of possible combinations of open/closed are possible: upper tier open with lower tier open, upper tier closed with lower tier open, upper tier open with lower tier closed, upper tier closed with lower tier closed. The case in which the upper tier is closed with lower tier closed means that the physical block is closed. If either tier is open, the physical block is open (note that open includes partially open). In an embodiment, the memory controller 120 will track the last word line programmed in each tier in order to determine the degree of open-ness. The degree of open-ness may refer to either the percentage of word lines in the physical block that are unprogrammed or the number of word lines in the physical block that are unprogrammed. In an embodiment, one or more parameters during open block read depend on the degree of open-ness of the physical block. Also note that the physical block could be operated as more than two tiers.

Further note that order in which the word lines are programmed can vary. In one embodiment, word lines are programmed from the bit line side to the source line side. In one embodiment, word lines are programmed from the source line side to the bit line side. In one embodiment, word lines are programmed in a different order in the upper tier 421 than the lower tier 423.

Figure 4D:
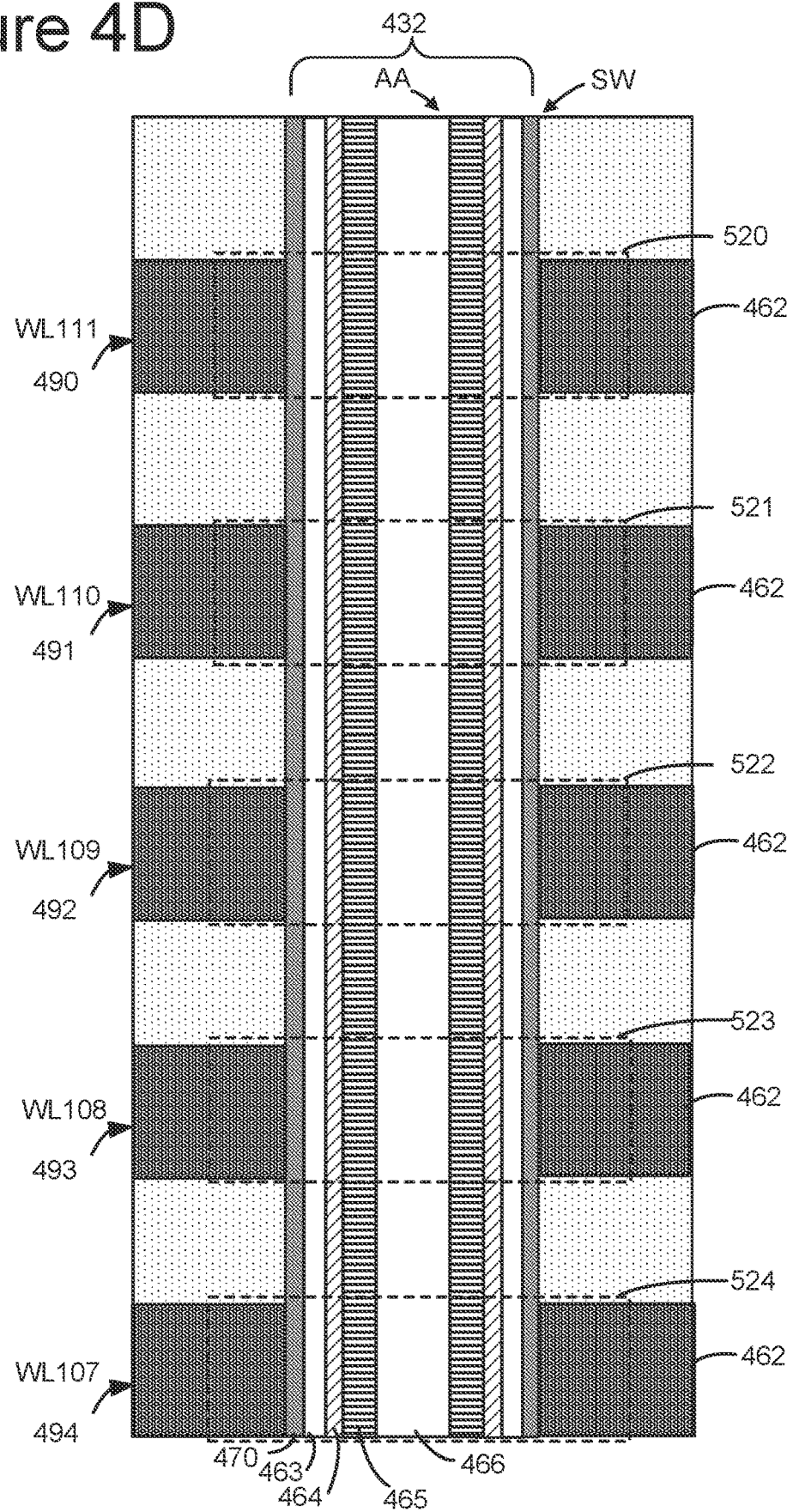
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
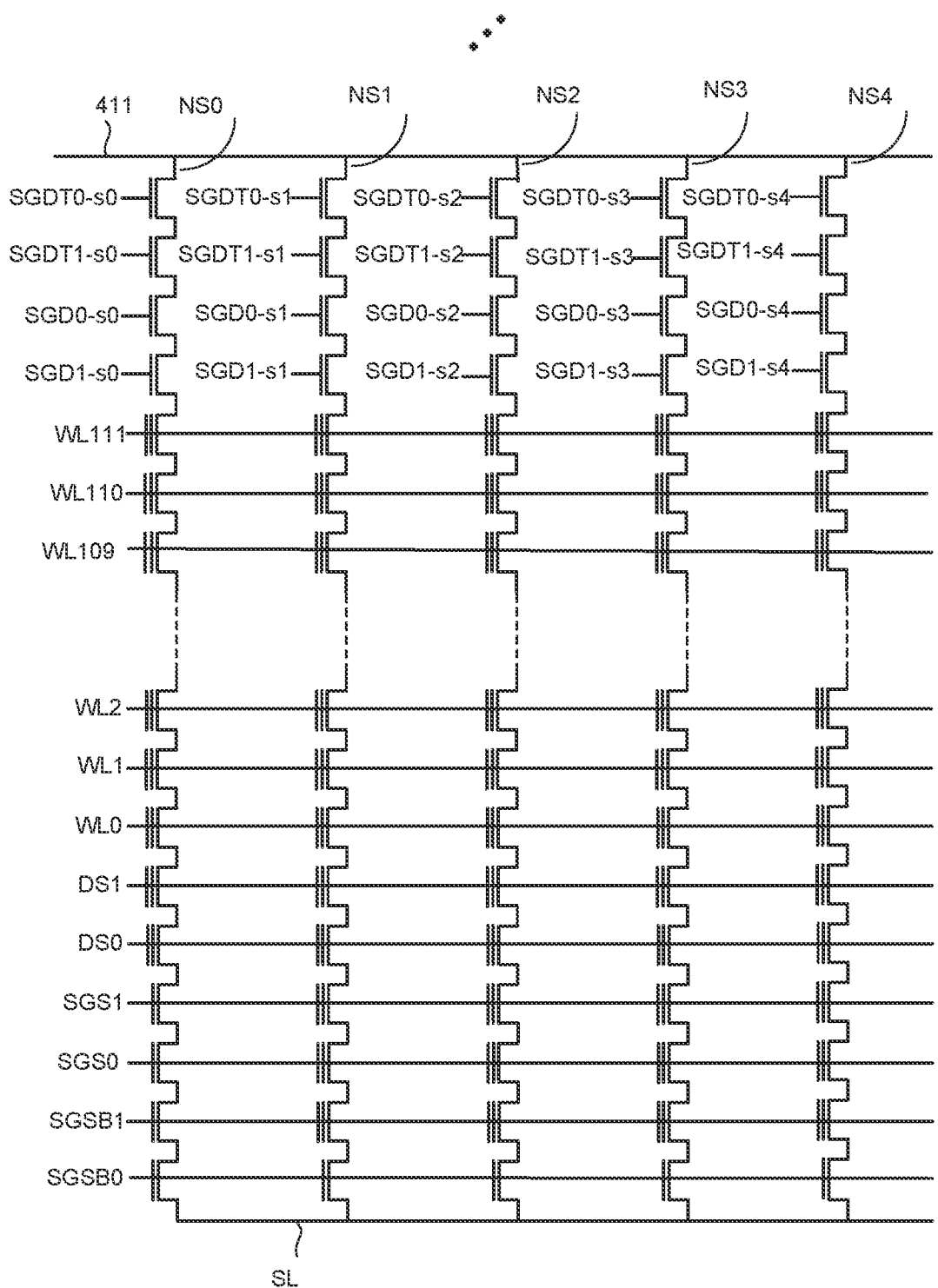
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the physical block. For example, the set of drain side select lines connected to NS0 include SGDT0-s0, SGDT1-s0, SGD0-s0, and SGD1-s0. The set of drain side select lines connected to NS1 include SGDT0-s1, SGDT1-s1, SGD0-s1, and SGD1-s1. The set of drain side select lines connected to NS2 include SGDT0-s2, SGDT1-s2, SGD0-s2, and SGD1-s2. The set of drain side select lines connected to NS3 include SGDT0-s3, SGDT1-s3, SGD0-s3, and SGD1-s3. The set of drain side select lines connected to NS4 include SGDT0-s4, SGDT1-s4, SGD0-s4, and SGD1-s4. Herein the term "SGD" may be used as a general term to refer to any one or more of the lines in a set of drain side select lines. In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-s0, SGDT1-s0, SGD0-s0, and SGD1-s0. A second sub-block corresponds to those vertical NAND strings controlled by SGDT0-s1, SGDT1-s1, SGD0-s1, and SGD1-s1. A third sub-block corresponds to those vertical NAND strings controlled by SGDT0-s2, SGDT1-s2, SGD0-s2, and SGD1-s2. A fourth sub-block corresponds to those vertical NAND strings controlled by SGDT0-s3, SGDT1-s3, SGD0-s3, and SGD1-s3. A fifth sub-block corresponds to those vertical NAND strings controlled by SGDT0-s4, SGDT1-s4, SGD0-s4, and SGD1-s4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase unit. For example, memory cells connected to WL0-WL55 may be in the lower tier 423 and memory cells connected to WL56-WL111 may be in the upper tier 421. Hence, memory cells connected to WL0-WL55 may be in one erase unit and memory cells connected to WL56-WL111 may be in another erase unit. A physical block could be operated in more than two tiers. Erase units can be formed based on other divisions of physical blocks.

Although the example memories of FIGS. 4-4E are three dimensional memory structure that includes vertical NAND strings with charge-trapping material, other 3D memory structures can also be used with the technology described herein.

Figure 5A:
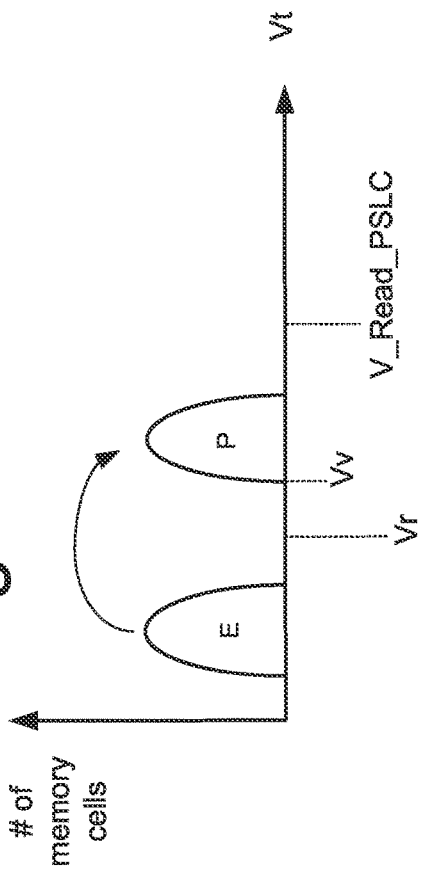
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIG. 5A also depicts a nominal read pass voltage (V_Read_PSLC). The nominal read pass voltage may be applied to unselected word lines during one embodiment of a read. The nominal read pass voltage is typically used during a closed block read. The nominal read pass voltage has a higher magnitude than the highest Vt in the P-state such that all memory cells connected to the unselected word line (whether in the E or P-state) should conduct a current. In some embodiments of an open block read, a lower than nominal read pass voltage is applied to unselected word lines having all memory cells in the E-state. The less than nominal read pass voltage could be about Vr, as an example. The nominal read pass voltage could overdrive the E-state cells, thereby resulting in an increase in peak Icc and/or average Icc. However, applying the less than nominal read pass voltage to unselected word lines having only E-state cells reduces peak Icc and/or average Icc.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
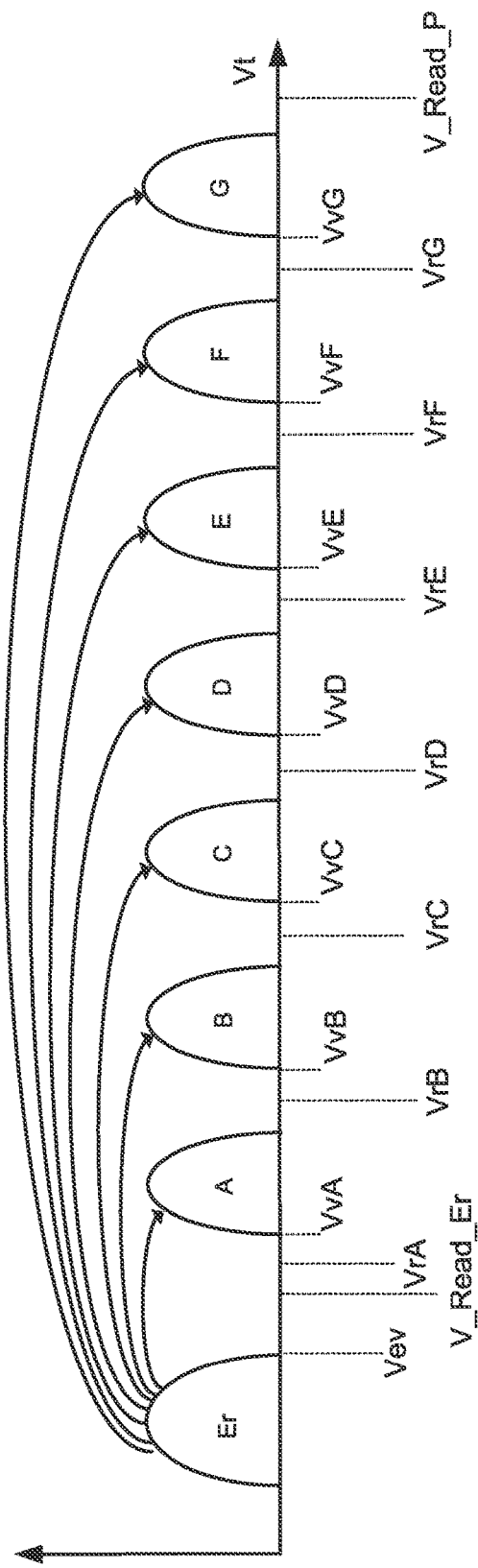

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

FIG. 5B also depicts a nominal read pass voltage (V_Read_P). The nominal read pass voltage may be applied to unselected word lines during one embodiment of an MLC read. The nominal read pass voltage is typically used during a closed block read. The nominal read pass voltage has a higher magnitude than the highest Vt in the G-state such that all memory cells connected to the unselected word line (regardless of state) should conduct a current. In some embodiments of an open block read, a lower than nominal read pass voltage is applied to unselected word lines having all memory cells in the Er-state. The less than nominal read pass voltage could be about V_Read_Er, as an example. However, the less than nominal read pass voltage may be a higher magnitude voltage. For example, the less than nominal read pass voltage could be greater than Vra, greater than VrB, or even greater than VrC. The nominal read pass voltage could overdrive the Er-state cells, thereby resulting in an increased in peak Icc and/or average Icc. However, applying the less than nominal read pass voltage to unselected word lines having only Er-state cells reduces peak Icc and/or average Icc. An example of the nominal V_Read_P is about 7V. An example of the less then nominal read pass voltage is about 3V (note that this may be greater than V_Read_Er).

FIG. 6 is a flowchart of one embodiment of a process 600 of reading memory cells. The process 600 may be performed by, but is not limited to, a combination of one or more of memory controller 120, system control logic 260, column control circuitry 210, and/or row control circuitry 220. In one embodiment, the process 600 is performed in response to a request from the host 102 to read data from storage 130.

Step 602 includes selecting a block for a read operation. The memory controller 120 may select the physical block in storage 130 based on its L2P tables. Step 602 may include the memory controller 120 translating a logical address in a read request from the host 102 to a physical address in storage 130.

Step 604 includes a determination of whether the physical block to be read is an open block or a closed block. In an embodiment, the memory controller 120 tracks what word lines are programmed and unprogrammed in each physical block. One technique is for the memory controller 120 to track that last word line that was programmed in the selected block. The memory controller may program the word lines in a pre-determined order, such that knowing the last programmed word line will indicate which word lines are programmed and unprogrammed in the selected block.

Steps 606-614 describe one embodiment of a read operation. These steps 606-614 may be controlled by the system control logic 260 (which controls column control circuitry 210 and row control circuitry 220). The memory controller 120 may send a read command to the system control logic 260. The memory controller 120 may also indicate whether the read is to be an open block read or a closed block read. The memory controller 120 may also indicate the last word line that was programmed in the event that this is an open block read. In the event that the physical block is operated as multiple tiers (e.g., upper tier 421, lower tier 423), the memory controller 120 may indicate the last word line that was programmed in each tier.

Step 606 is performed if this is an open block read. Step 608 is performed if this is a closed block read. Step 606 includes applying a lower voltage to the bit lines. Step 608 includes applying a higher voltage to the bit lines. That is, the bit line voltage for the open block read has a lower magnitude than the bit line voltage for the closed block read. In one embodiment, the bit line voltage for the closed block read is about 0.3V. In one embodiment, the bit line voltage for the open block read is about 0.1V to 0.3V (but being less than the closed block read). In one embodiment, the magnitude of the bit line voltage for the open block read depends on how many word lines are unprogrammed (or erased). In an embodiment, the more open the block (e.g., more unprogrammed word lines or higher percentage of unprogrammed word lines) the lower the bit line voltage. Thus, in an embodiment, there is a negative correlation (or inverse correlation) between the percentage of unprogrammed word lines and the bit line voltage.

Step 610 includes applying a read pass voltage (Vread) to unselected word lines. The unselected word lines are those word lines in the physical block that do not connect to any of the memory cells that are selected for read. The memory cells connected to the unselected word lines are unselected memory cells. The read pass voltage has a sufficient magnitude such that all of these unselected memory cells should conduct a significant current. Thus, the read pass voltage applied to a particular unselected word line has a magnitude that is at least as high as the highest Vt of the unselected memory cells on the particular unselected word line. In some embodiments, a relatively high magnitude is used for Vread if the unselected word line is programmed (i.e., contains programmed memory cells). However, a relatively low magnitude may be used for Vread if the unselected word line is unprogrammed (i.e., does not contain any programmed memory cells—in other words all memory cells are in the erased state). With reference to FIG. 5B as one example, V_Read_P could be applied to unselected word lines having memory cells programmed to the Vt distributions in FIG. 5B. However, if all of the memory cells on the unselected word line are still in the Er state, then V_Read_Er could be used. Note that V_Read_Er is just one example—a value such as VrA or even higher could be used. With reference to FIG. 5A as one example, V_Read_PSLC could be applied to unselected word lines having memory cells programmed to the Vt distributions in FIG. 5A. However, for the SLC example if all of the memory cells are still in the E state, then a voltage near Vr may be used for Vread. In this case, Vread could be below Vr, at Vr, or above Vr.

Step 612 includes applying a read reference voltage (Vcgr) to the selected word line. The selected word line is the word line that is connected to the memory cells to be read. Examples of the read reference voltage are depicted in FIG. 5A (SLC) and FIG. 5B (MLC). In step 612 just one read reference voltage is applied to the selected word line.

Step 614 includes sensing the bit lines. The bit lines are sensed while the bit lines are at the voltage established in step 606 or 608, while Vread is applied to the unselected word lines, and while Vcgr is applied to the selected word line. After sensing the bit lines, a determination is made whether the bit line had a significant current. If so, then the selected memory cell on the NAND string connected to the bit line has a Vt below Vcgr. If the bit line does not have a significant current then the selected memory cell on the NAND string connected to the bit line does not have a Vt below Vcgr. This information may be recorded in a latch or the like in the sense amplifier connected to the bit line. Steps 612 and 614 may be repeated for one or more additional read reference voltages (Vcgr) in order to read one page of data from the selected memory cells.

FIG. 7 is a flowchart of one embodiment of a process 700 of establishing read parameters for an open block read of memory cells. The process 700 may be performed by, but is not limited to, memory controller 120. In one embodiment, the process 700 is performed in response to a request from the host 102 to read data from storage 130.

Step 702 includes identifying the edge word line in the open block. The edge word line refers to the last word line that was programmed. In the event that the physical block is operated as more than one tier then there may be more than one edge word lines. For example, there could be an edge word line in the upper tier 421 and an edge word line in the lower tier 423. It is also possible that one tier may be open (at least one word line in the tier is unprogrammed) with the other tier being closed (all word lines programmed). Also, the physical block could be operated as more than two tiers (e.g., an upper tier, middle tier, and lower tier). In one embodiment, the memory controller 120 tracks the edge word lines for each block (or tier).

Step 704 includes the memory controller 120 sending a read command to the die (e.g., 200, 211). The read command contains the address of the physical block, as well as the address of the selected word line. The read command could be a read command in the Open NAND Flash Interface (ONFI). However, ONFI is not a requirement.

Step 706 includes the memory controller 120 sending a command to the die (e.g., 200, 211) to apply a lower than nominal bit line voltage for the open block read. In an embodiment, the die may access a parameter table that specifies the bit line voltage for the open block read. The memory structure 202 may store open block read parameters 216, which may be loaded into storage 266 when the die is powered on. The memory controller could send a vendor specific command in the ONFI. However, ONFI is not a requirement.

Step 708 includes the memory controller 120 sending a command to the die to apply a lower than nominal read pass voltage for unprogrammed word lines and a nominal read pass voltage for programmed word lines. In an embodiment, the die may access the parameter table that specifies the magnitude of the Vread voltages for the unprogrammed and programmed word lines. The memory controller could send a vendor specific command in the ONFI. However, ONFI is not a requirement.

Step 710 includes the memory controller 120 sending a command to the die to apply use a slower ramp rate for the read pass voltage (Vread) for the open block read than would be used for a closed block read. The memory controller could send a vendor specific command in the ONFI. However, ONFI is not a requirement. In an embodiment, the die may access the parameter table that specifies the ramp rate of the Vread for the open block read, as well as for the closed block read. There are several variations of process 700. For example, different combinations of steps 706, 708, and 710 may be performed. For example, step 708 and/or 710 may be skipped.

Figure 8A:
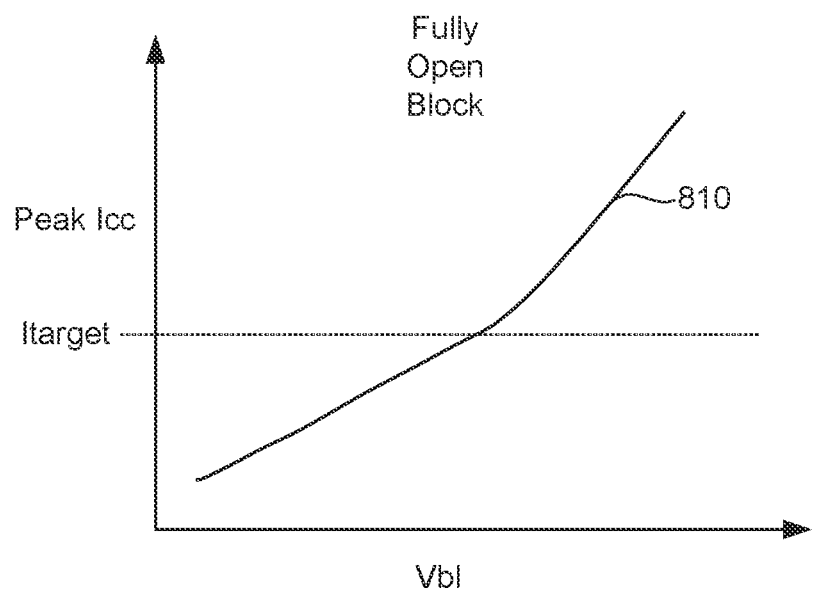
FIGS. 8A-8E are graphs depicting curves of Icc versus bit line voltage (Vbl).

FIG. 8A is a graph depicting a curve of an example of peak Icc versus bit line voltage (Vbl) for read of a "fully" open block. A fully open block refers to a block that is as open as possible, such as a block in which the word line selected for reading is the only programmed word line in the physical block. The curve 810 shows a positive correlation between bit line voltage and Icc. That is, a higher Vbl results in a higher Icc. A dashed horizontal line indicates Itarget, which represents a target peak Icc. By reducing the bit line voltage sufficiently, the peak Icc can be kept under the target peak Icc.

Figure 8B:
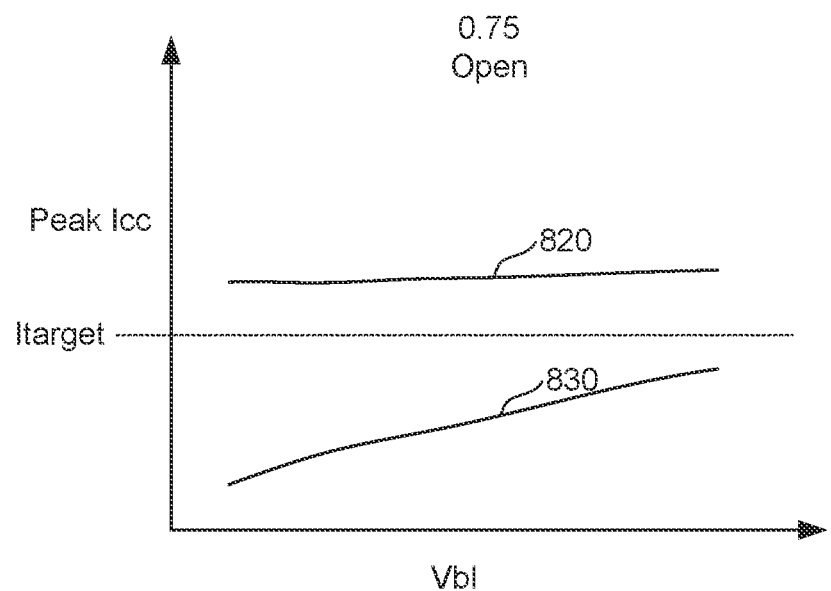

FIG. 8B is a graph depicting curves of an example of peak Icc versus bit line voltage (Vbl) for a block that is about 75% open. A 75% open block refers to a physical block having about 75% of the word lines unprogrammed and about 25% of the word line programmed. Two curves 820, 830 are depicted. The curves are for different ramps rates of the read pass voltage (Vread). Curve 820 is for a nominal ramp rate that may be used for a closed block read. Curve 830 is for a slower ramp rate that is used in an embodiment of open block read. Note that in this example, there might not be a strong correlation between peak Icc and bit line voltage for the nominal ramp rate (curve 820). However, there is a significant positive correlation between peak Icc and bit line voltage for the slower ramp rate (curve 830). Thus, it is possible that reducing the bit line voltage while using the nominal ramp rate does not keep the peak Icc under the target peak Icc. In one embodiment, a lower than nominal bit line voltage is combined with a slower ramp rate for Vread in order to reduce peak Icc in an open block read. In one embodiment, the slower ramp rate for Vread is used based on how open the block is (e.g., what percentage of word lines are programmed).

Figure 8C:
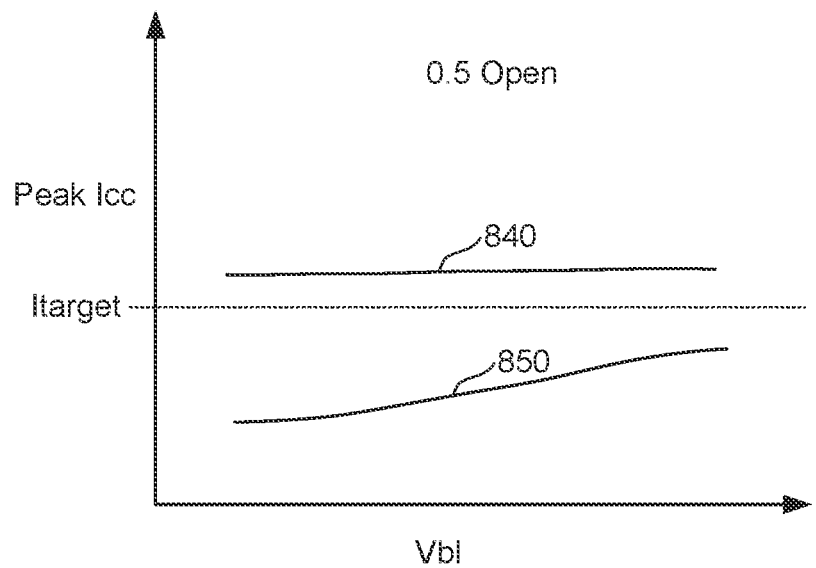

FIG. 8C is a graph depicting curves of an example of peak Icc versus bit line voltage (Vbl) for a block that is about 50% open. A 50% open block refers to a physical block having about 50% of the word lines unprogrammed and about 50% of the word line programmed. Two curves 840, 850 are depicted. The curves are for different ramps rates of the read pass voltage (Vread). Curve 840 is for a nominal ramp rate that might be used for a closed block read. Curve 850 is for a slower ramp rate that is used in an embodiment of open block read. The curves 840, 850 indicate a similar phenomenon that was discussed in the example of FIG. 8B. It is possible that peak Icc exceeds the target peak Icc even with a low bit line voltage for curve 840. However, using the slower ramp rate combined with the lower bit line voltage may keep peak Icc below the target peak Icc. Note the depending on the level of the target peak Icc, just slowing the ramp rate of Vread might not be enough to keep peak Icc below the target peak Icc.

Figure 8D:
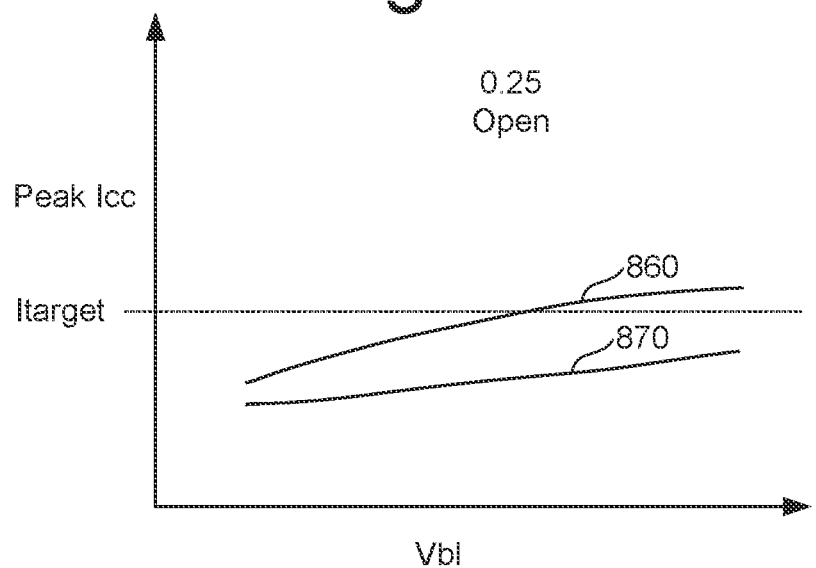

FIG. 8D is a graph depicting curves of an example of peak Icc versus bit line voltage (Vbl) for a block that is about 25% open. A 25% open block refers to a physical block having about 25% of the word lines unprogrammed and about 75% of the word line programmed. Two curves 860, 870 are depicted. The curves are for different ramps rates of the read pass voltage (Vread). Curve 860 is for a nominal ramp rate that might be used for a closed block read. Curve 870 is for a slower ramp rate that is used in an embodiment of open block read. In this example, curve 860 indicates that there is a positive correlation between peak Icc and bit line voltage for both the nominal ramp rate (curve 860) and the slower ramp rate (870). Moreover, at lower bit line voltages curve 860 is below the target peak Icc. Thus, in this example, the nominal ramp rate could be used with the lower than normal bit line voltage to save considerable peak Icc and stay below the target peak Icc.

Figure 8E:
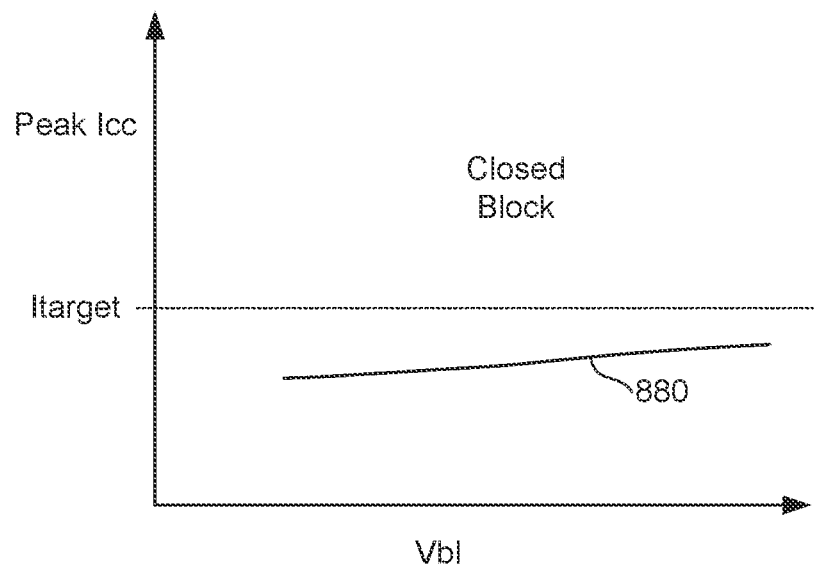

FIG. 8E is a graph depicting a curve of an example of peak Icc versus bit line voltage (Vbl) for a closed block. A closed block refers to a physical block having all of the word lines programmed. Curve 880 is for the nominal ramp rate. Curve 880 indicates that although peak Icc might not be identical regardless of bit line voltage, there is not much peak Icc saving using the lower bit line voltage. Moreover, even with the higher bit line voltage, the peak Icc can be kept below the target peak Icc.

The curves in FIGS. 8A-8E are for an example 3D NAND architecture. The peak Icc curves may be different for architectures having different physical parameters and characteristics.

Figure 9:
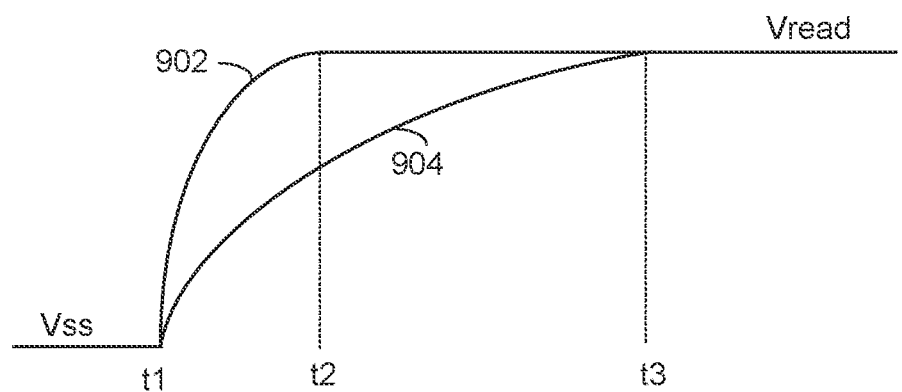
FIG. 9 depicts two different ramp rates for ramping the voltage on the unselected word lines to Vread.

FIG. 9 depicts two different ramp rates for ramping the voltage on the unselected word lines to Vread. Curve 902 is a faster (e.g., nominal) ramp rate. Curve 904 is a relaxed (e.g., slower than nominal) ramp rate. Curve 902 starts at Vss (e.g., 0V) at t1 and reaches Vread read by t2. Curve 904 starts at Vss at t1 and reaches Vread read by t3. In an embodiment, the faster ramp rate (curve 902) is used for closed block reads in combination with a nominal bit line voltage. In an embodiment, the relaxed ramp rate (curve 904) is used for open block reads in combination with a lower than nominal bit line voltage. In an embodiment, the relaxed ramp rate (curve 904) is used for some but not all open block reads. For example, the slower ramp rate (curve 904) may be used for a middle range of open-ness with the nominal ramp rate used for high-and low-ranges of openness.

In one embodiment, the storage system 100 establishes the ramp rate of the read pass voltage as a first ramp rate if the percentage of the unselected word lines in the target block that are unprogrammed is above a first threshold. The storage system 100 establishes the ramp rate of the read pass voltage as a second ramp rate if the percentage of the unselected word lines in the target block that are unprogrammed is below a second threshold. The first and second ramp rates could be the same or different. The first and/or second ramp rates could be nominal ramp rates that are used in a closed block read, but that is not required. The storage system 100 establishes the ramp rate of the read pass voltage as a third ramp rate if the percentage of the unselected word lines in the target block that are unprogrammed is between the first threshold and the second threshold. The third ramp rate is slower than the first ramp rate and slower than the second ramp rate. As one example, the first ramp rate could be used for the open block example in FIG. 8A, the third ramp rate could be used for the open block examples in FIGS. 8B and 8C, and the second ramp rate could be used for the open block example in FIG. 8D.

Figure 10:
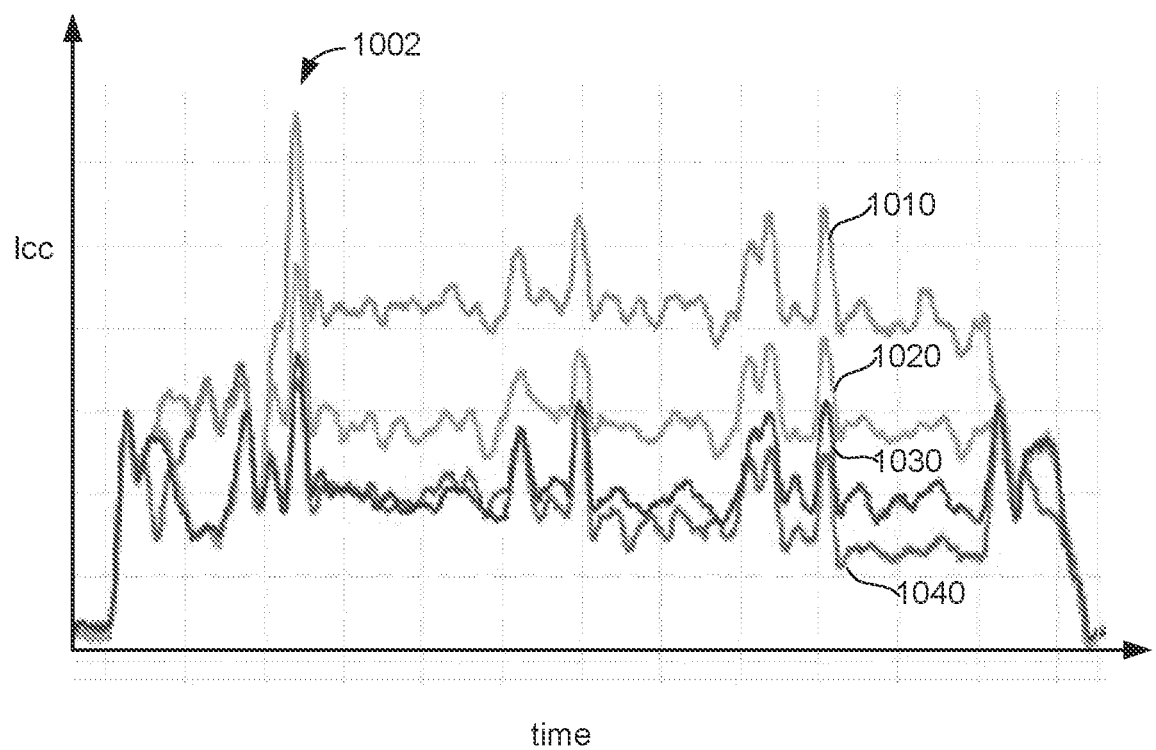
FIG. 10 is a graph showing Icc versus time during example reads using different parameters.

In some embodiments, the storage system 100 controls Icc by both a reduction in the bit line voltage and using a lower read pass voltage for unselected word lines that are erased. FIG. 10 is a graph showing Icc versus time during example reads using different parameters. Curve 1010 shows an example Icc versus time for an example fully open block that is read with nominal bit line voltages and a nominal Vread to all unselected word lines. Curve 1020 shows an example Icc versus time for an example of a fully open block that is read with nominal bit line voltages and a lower than nominal Vread to all unselected word lines. Curve 1020 shows a substantial reduction to the Icc relative to curve 1010 throughout the open block read, including a substantial reduction in the peak Icc 1002. Curve 1030 shows an example Icc versus time for an embodiment of the fully open block that is read with lower the nominal bit line voltages and a lower than nominal Vread to all unselected word lines. Curve 1030 shows a further reduction to the Icc relative to curve 1020 throughout the open block read, including a substantial reduction in the peak Icc 1002. Curve 1040 is for an example closed block read, which uses the nominal bit line voltage and the nominal read pass voltage. Curve 1030 shows only slightly higher Icc throughout the open block read compared to curve 1040 for the closed block read.

In view of the foregoing, an embodiment includes an apparatus comprising one or more control circuits configured to connect to a three-dimensional memory structure comprising blocks comprising NAND strings having memory cells. Each block comprises word lines. Each word line of a block is connected to each NAND string in the block. The memory structure has bit lines associated with the NAND strings. The one or more control circuits are configured to apply a first bit line voltage to the bit lines while applying a read reference voltage to a selected word line in a target block during an open block read in the target block. The first bit line voltage has a first magnitude. The one or more control circuits are configured to apply a second bit line voltage to the bit lines while applying the read reference voltage to the selected word line during a closed block read of the target block. The second bit line voltage has a second magnitude that is greater than the first magnitude.

In a further embodiment, the one or more control circuits are further configured to establish the first magnitude based on a percentage of the word lines in the target block that are unprogrammed.

In a further embodiment, the one or more control circuits are further configured to establish the first magnitude to have a negative correlation with a percentage of the word lines in the target block that are unprogrammed.

In a further embodiment, the one or more control circuits are further configured to control a ramp rate of a read pass voltage applied to unselected word lines in the target block during the open block read. The ramp rate depends on a percentage of the unselected word lines in the target block that are unprogrammed.

In a further embodiment, the one or more control circuits are further configured to establish the ramp rate of the read pass voltage as a first ramp rate in response to the percentage of the unselected word lines in the target block that are unprogrammed being above a first threshold. The one or more control circuits are further configured to establish the ramp rate of the read pass voltage as a second ramp rate in response to the percentage of the unselected word lines in the target block that are unprogrammed being below a second threshold. The one or more control circuits are further configured to establish the ramp rate of the read pass voltage as a third ramp rate in response to the percentage of the unselected word lines in the target block that are unprogrammed being between the first threshold and the second threshold. The third ramp rate is slower than the first ramp rate and slower than the second ramp rate.

In a further embodiment, the one or more control circuits are further configured to apply a first read pass voltage to first unselected word lines in the target block during the open block read. The first unselected word lines are programmed and the first read pass voltage has a third magnitude. The one or more control circuits are further configured to apply a second read pass voltage to second unselected word lines in the target block during the open block read. The second unselected word lines are unprogrammed and the second read pass voltage has a fourth magnitude that is lower than the third magnitude.

In a further embodiment, the one or more control circuits comprise a memory controller configured to issue a command to system control logic to apply a lower than nominal voltage as the first bit line voltage to the bit lines during the open block read. The second bit line voltage being the nominal voltage.

In a further embodiment, the one or more control circuits comprise the system control logic. The system control logic is configured to access a parameter from storage that specifies the first magnitude for the first bit line voltage during the open block read. The system control logic is configured to apply the first bit line voltage to the bit lines during the open block read.

In a further embodiment, the one or more control circuits comprise a memory controller configured to identify a last word line programmed in the target block. The memory controller is configured to send an address of the last word line programmed in the target block to system control logic that is configured to apply the first bit line voltage to the bit lines and read pass voltages to unselected word lines in the target block during the open block read.

In a further embodiment, the memory controller is further configured to issue a command to the system control logic to apply a nominal read pass voltage to programmed unselected word lines in the target block and a lower than nominal read pass voltage to unprogrammed unselected word lines in the target block during the open block read.

In a further embodiment, the memory controller further configured to issue a command to the system control logic to use a slower than nominal ramp rate for the read pass voltages during the open block read. The system control logic is configured to apply the nominal ramp rate for the read pass voltages during the closed block read and apply the slower than nominal ramp rate for the read pass voltages during the open block read.

In a further embodiment, the apparatus comprises a first semiconductor die that comprises the three-dimensional memory structure. The apparatus comprises a second semiconductor die that comprises at least a portion of the one or more control circuits that are configured to control the open block read at a die level.

An embodiment comprises a method of operating non-volatile storage. The method comprises applying a read compare voltage to a selected word line connected to selected memory cells on a group of NAND strings. The method comprises applying one or more read pass voltages to unselected word lines connected to unselected memory cells on the group of NAND strings. The method comprises applying a bit line voltage to bit lines connected to the group of NAND strings. The bit line voltage has a magnitude that depends on how many of the unselected memory cells are programmed. The method comprises sensing the bit lines to determine conditions of the selected memory cells.

One embodiment includes a non-volatile storage system, comprising a three-dimensional memory structure comprising blocks comprising NAND strings having memory cells. Each block comprises word lines. Each word line of a block is connected to each NAND string in the block. The memory structure has bit lines associated with the NAND strings. The non-volatile storage system comprises one or more control circuits in communication with the three-dimensional memory structure and configured to apply a read compare voltage to a selected word line in a target block connected to selected memory cells on a group of NAND strings in the target block. The one or more control circuits are configured to apply a read pass voltage to unselected word lines in the target block connected to unselected memory cells on the group of the NAND strings. The one or more control circuits are configured to apply a bit line voltage to bit lines connected to the group of NAND strings. The bit line voltage has a magnitude that depends on how many of the unselected word lines in the target block are programmed. The one or more control circuits are configured to sense the bit lines to determine conditions of the selected memory cells.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a three-dimensional memory structure comprising blocks comprising NAND strings having memory cells, each block comprising word lines, each word line of a block connected to each NAND string in the block, the memory structure having bit lines associated with the NAND strings, wherein the one or more control circuits are configured to:
apply a first bit line voltage to the bit lines while applying a read reference voltage to a selected word line and ramping a read pass voltage applied to unselected word lines at a first ramp rate in a target block during a first open block read in the target block, wherein the first bit line voltage has a first magnitude, the first open block read being between a first percentage of open word lines and a fully open block;
apply the first bit line voltage to the bit lines while applying the read reference voltage to the selected word line and ramping the read pass voltage applied to the unselected word lines at a second ramp rate in the target block during a second open block read in the target block, wherein the second ramp rate is slower than the first ramp rate, the second open block read being between the first percentage of open word lines and a second percentage of open word line that is less than the first percentage; and
apply a second bit line voltage to the bit lines while applying the read reference voltage to the selected word line and ramping the read pass voltage applied to the unselected word lines at the first ramp rate in the target block during a closed block read of the target block, wherein the second bit line voltage has a second magnitude that is greater than the first magnitude.

2. The apparatus of claim 1, wherein the one or more control circuits are further configured to:
control the second ramp rate of the read pass voltage applied to unselected word lines in the target block during the second open block read, wherein the second ramp rate depends on the percentage of the unselected word lines in the target block that are unprogrammed.

3. The apparatus of claim 1, wherein the one or more control circuits are further configured to:
apply a first read pass voltage to first unselected word lines in the target block during the second open block read, wherein the first unselected word lines are programmed and the first read pass voltage has a third magnitude; and
apply a second read pass voltage to second unselected word lines in the target block during the second open block read, wherein the second unselected word lines are unprogrammed and the second read pass voltage has a fourth magnitude that is lower than the third magnitude.

4. The apparatus of claim 1, wherein the one or more control circuits comprise a memory controller configured to:
issue a command to system control logic to apply a lower than nominal voltage as the first bit line voltage to the bit lines during the first and second open block reads, the second bit line voltage being the nominal voltage.

5. The apparatus of claim 4, wherein the one or more control circuits comprise the system control logic, the system control logic is configured to:
access a parameter from storage that specifies the first magnitude for the first bit line voltage during the first and second open block reads; and
apply the first bit line voltage to the bit lines during the first and second open block reads.

6. The apparatus of claim 1, wherein the one or more control circuits comprise a memory controller configured to:
identify a last word line programmed in the target block; and
send an address of the last word line programmed in the target block to system control logic that is configured to apply the first bit line voltage to the bit lines and read pass voltages to unselected word lines in the target block during the first and second open block reads.

7. The apparatus of claim 6, wherein the memory controller is further configured to:
issue a command to the system control logic to apply a nominal read pass voltage to programmed unselected word lines in the target block and a lower than nominal read pass voltage to unprogrammed unselected word lines in the target block during the first and second open block reads.

8. The apparatus of claim 6, wherein:
the memory controller is further configured to issue a command to the system control logic to use a slower than nominal ramp rate for the read pass voltages during the second open block read; and
the system control logic is configured to apply the nominal ramp rate for the read pass voltages during the closed block read and apply the slower than nominal ramp rate for the read pass voltages during the open block read, the nominal ramp rate being the first ramp rate, the slower than nominal ramp rate being the second ramp rate.

9. The apparatus of claim 1, wherein the apparatus comprises:
a first semiconductor die that comprises the three-dimensional memory structure; and
a second semiconductor die that comprises at least a portion of the one or more control circuits that are configured to control the open block read at a die level.

10. A non-volatile storage system, comprising:
a three-dimensional memory structure comprising blocks comprising NAND strings having memory cells, each block comprising word lines, each word line of a block connected to each NAND string in the block, the memory structure having bit lines associated with the NAND strings;
one or more control circuits in communication with the three-dimensional memory structure and configured to:
apply a read compare voltage to a selected word line in a target block connected to selected memory cells on a group of NAND strings in the target block;
apply a read pass voltage to unselected word lines in the target block connected to unselected memory cells on the group of the NAND strings, the read pass voltage having a nominal ramp rate in response to the target block being between a first percentage open word lines and fully open, the read pass voltage having a slower than nominal ramp rate in response to the target block being less than the first percentage open word lines but more than a second percentage open word lines, the read pass voltage having the nominal ramp rate in response to the target block being closed;
apply a bit line voltage to bit lines connected to the group of NAND strings, the bit line voltage having a nominal magnitude in response to the target block being closed, the bit line voltage having a less than nominal magnitude in response to the target block being open; and
sense the bit lines to determine conditions of the selected memory cells.

11. The non-volatile storage system of claim 10, wherein applying the read pass voltage to the unselected word lines in the target block comprises the one or more control circuits:
applying a first read pass voltage having a first magnitude to first unselected word lines connected to first unselected memory cells that are all erased; and
applying a second read pass voltage having a second magnitude to second unselected word lines connected to second unselected memory cells that are programmed, wherein the second magnitude is greater than the first magnitude.

12. A method of reading NAND memory, the method comprising:
combining a nominal magnitude bit line voltage with a nominal ramp rate for read pass voltages applied to unselected word lines in response to a block of NAND memory cells being closed;
combining a less than nominal magnitude bit line voltage with the nominal ramp rate for the read pass voltages applied to the unselected word lines in response to the block of the NAND memory cells being more than a first percentage open and up to fully open; and
combining the less than nominal magnitude bit line voltage with a slower than nominal ramp rate for the read pass voltages applied to the unselected word lines in response to the block of the NAND memory cells being less than the first percentage open but more than a second percentage open.

* * * * *